(12) United States Patent
Verkinderen et al.

(10) Patent No.: US 6,194,913 B1
(45) Date of Patent: Feb. 27, 2001

(54) OUTPUT CIRCUIT FOR DIGITAL INTEGRATED CIRCUIT DEVICES

(75) Inventors: Johan Gabriël August Verkinderen, Sint-Amandsberg; Joannes Mathilda Josephus Sevenhans, Brasschaat, both of (BE)

(73) Assignee: Alcatel, Paris (FR)

(*) Notice: Subject to any disclaimer, the term of this patent is extended or adjusted under 35 U.S.C. 154(b) by 0 days.

(21) Appl. No.: 09/212,277

(22) Filed: Dec. 16, 1998

(30) Foreign Application Priority Data

Dec. 22, 1997 (EP) .................................................. 97403124

(51) Int. Cl.[7] ............................................. H03K 19/0175
(52) U.S. Cl. ................................. 326/83; 326/87; 326/86
(58) Field of Search ................................. 326/82, 83, 86, 326/87

(56) References Cited

U.S. PATENT DOCUMENTS

| | | | |
|---|---|---|---|
| 4,815,113 | * 3/1989 | Ludwig et al. | 377/39 |
| 5,568,068 | * 10/1996 | Ota et al. | 326/82 |
| 5,621,335 | 4/1997 | Andresen . | |
| 5,677,639 | 10/1997 | Msasiewicz . | |
| 5,808,478 | * 9/1998 | Andresen | 326/31 |

FOREIGN PATENT DOCUMENTS

| | | |
|---|---|---|
| 0 443 435 A1 | 8/1991 | (EP) . |
| 0 463 316 A1 | 1/1992 | (EP) . |
| 0 482 392 A2 | 4/1992 | (EP) . |
| 0 793 347 A1 | 9/1997 | (EP) . |

* cited by examiner

*Primary Examiner*—Michael Tohar
*Assistant Examiner*—Anh Tran
(74) *Attorney, Agent, or Firm*—Sughrue, Mion, Zinn, Macpeak & Seas, PLLC

(57) ABSTRACT

An output circuit for digital integrated circuit devices is presented, comprising a driving device with adjustable drive capability for generating an output pulse (OS), means (SENS) for monitoring the steepness of the output pulse (OS), and means (SEL) adjusting the drive capability of the driving device so as to minimize the difference between the monitored steepness and a predetermined steepness. In a preferred embodiment, said driving device comprises a plurality of driving stages (PM1-NM1, PM2-NM2, PM3-NM3, PM4-NM4, PM5-NM5) which can be activated independently from each other, and the means (SEL) for adjusting the drive capability comprises means for activating one or more driving stages from the plurality of driving stages (PM1-NM1, PM2-NM2, PM3-NM3, PM4-NM4, PM5-NM5).

15 Claims, 2 Drawing Sheets

OUTPUT CIRCUIT FOR DIGITAL INTEGRATED CIRCUIT DEVICES

BACKGROUND OF THE INVENTION

The present invention relates to output circuits for high speed digital integrated circuit devices. Those digital integrated circuit devices generate digital pulses with typical frequencies up to several MHz.

The sharp rising and falling edges of the digital pulses generated by those digital integrated circuit devices induce so called switching noise, e.g. harmonic distortion, crosstalk, voltage supply dips, peak currents, etc. On the one hand, this switching noise presents several disruptive effects on the internal operation of the circuit, such as pulsing of noise on input and internal circuit ground and power supply lines or local threshold shifts in the reference voltages for high and low potential data signals causing false data signals. On the other hand, the noise causes EMC (electromagnetic compatibility) problems, e.g. radio frequency radiation interference and electromagnetic induction interference noise which may interfere with a host system.

Now, EMC requirements for digital integrated circuit devices are determined on a European level and have to be respected by any device sold. In order to meet these EMC requirements, the interference of the digital circuit with its environment has to be reduced, which means that the steepness of the rising and falling edges of the outgoing signal has to be reduced.

A solution to the above-mentioned problem is disclosed in European patent application EP-A-0 443 435. It relates to an output buffer circuit for integrated digital devices comprising a driving device with an adjustable drive capability. The driving device includes a first and a second output driving stage of different drive capabilities. These two driving stages are connected in parallel and operated sequentially in order to limit the charging or discharging currents of the external load capacitance.

During a transition from low to high at the input of the output buffer, only a first driving stage with a small drive capability is operated in a first step, whereby the external load capacitance is charged by a small charging/discharging current generated by the first driving stage. During this first charging step, the output voltage of the buffer circuit is permanently sensed and when the output voltage exceeds a predetermined threshold value, the second driving stage with a large drive capability is activated. The charging current is then considerably raised during this second step, thereby rapidly completing the charging of the external load capacitance.

During a transition from high to low at the input, the driving stages are operated accordingly in two steps. In a first step the external load capacitance is discharged by a small discharging current generated in the first driving stage. After the output voltage has dropped below a certain threshold value, the drive capability of the driving device is adjusted by activating the second driving stage whereby the discharging of the external load is rapidly completed.

By adjusting the drive capability of the driving device each time that the output voltage of the buffer circuit passes over a predetermined threshold value and thereby charging or discharging the external load capacitance in two steps as described, the output buffer circuit of EP-A-0 443 435 achieves an overall reduction of the steepness of the output signal compared to a driving device with a fixed drive capability, e.g. a single driving stage.

One drawback of the output buffer circuit of EP-A-0 443 435 is, that the steepness of the output pulse is largely dependent on the external load capacitance. In fact, in the presence of a large load capacitance, the small charging/discharging current during the first step and the large charging/discharging current during the second step result in a slow rise/fall of the output voltage, whereas the same currents in the presence of a small load capacitance result in a much faster rise/fall of the output voltage.

In other words, the steepness of the output pulses of the output buffer circuit described in EP-A-0 443 435 is largely depends on the output capacity of the circuit which is driven by the digital integrated circuit.

SUMMARY OF THE INVENTION

The object of the present invention is to provide an output circuit for digital integrated circuit devices being able to generate output pulses which are largely independent from an external load capacitance.

The present invention addresses this problem by providing an output circuit for digital integrated circuit devices, comprising a driving device with adjustable drive capability for generating an output pulse, monitor for monitoring the output pulse steepness, and a drive adjuster for adjusting the drive capability of the driving device that depending on the difference between the monitored steepness and a predetermined steepness.

During the generation of an output pulse in this output circuit, the actual steepness of the output pulse is monitored and compared to a predetermined target steepness. Based on the difference between said actual steepness and said target steepness, the drive capability is subsequently adjusted in order to reduce said difference. In other words, if the actual steepness is smaller than the predetermined target steepness, the drive capability of the driving device is increased. On the contrary, if the actual steepness is higher than the predetermined target steepness, the drive capability of the driving device is decreased.

The circuit according to the present invention thus operates as a control circuit, which maintains the steepness of the output pulses as close to the target value as possible, irrespective of other parameters which may influence the slope of the output voltage.

For a given drive capability of the driving device, the steepness of the outgoing signal will largely depend on the external load capacitance, i.e. for a large external load, the slope of the outgoing signal will be much lower than for a small external load. By adjusting the drive capability so that the steepness of the pulse will approximately match a predetermined value, the circuit of the present invention thus adapts the drive capability of the driving device to the external load capacitance. Consequently, the form of the outgoing signal is no longer influenced by the external load.

Besides obtaining an output slope independent of the external load capacitance, the steepness of the edges of outgoing pulses is made independent of temperature-changes and becomes insensitive for processing parameters of the digital integrated circuit. This represents a considerable advantage over the prior art solutions, where temperature rises have a decreasing effect on the drive strength (e.g. the current sourced by a MOSFET) of the outgoing circuit and consequently also on the steepness of the pulse edges.

In a preferred execution of the output circuit, said driving device comprises a plurality of driving stages which can be activated independently from each other, and a drive adjuster for adjusting the drive capability comprises means for activating one or more driving stages from said plurality of driving stages. It has to be noted, that the term "activate"

in this context must be understood in a very general sense. In fact, the term "activating a driving stage" can stand for "connecting an operating, but previously not connected driving stage into the output circuit", so that it contributes to the generation of the necessary charging/discharging current. Alternatively "activate" can have the meaning of "start the operation of a previously connected driving stage".

In a first embodiment, the driving stages have identical drive capabilities and said drive adjuster for adjusting the drive capability comprises means for activating an adequate number of said driving stages. In this case, the adjustment of the drive capability is realised by varying the number of activated driving stages. The activated driving stages are connected in parallel, so that their respective charging currents are added in order to form the charging/discharging current necessary to charge/discharge an external load capacitance. If the steepness of the resulting pulse is too high with respect to the target steepness, the number of activated driving stages is reduced. In the other case, if the edge of the resulting signal is too smooth, the number of activated driving stages is increased in order to increase the overall drive capability of the driving device.

It has to be noted that the drive capability of the driving stages is preferably chosen so as to generate, in the presence of the smallest load capacitance to be expected and with one single activated driving stage, an output signal with a steepness which is less than or equal to the predetermined target steepness. The overall number of driving stages is preferably chosen, so as to generate, in the presence of the largest load capacitance to be expected and with all the driving stages activated, an output signal with a steepness which is higher than or equal to the predetermined target steepness. The resulting output circuit is able to generate the required pulse form over a wide range of load capacities. In a second embodiment, said driving stages have different drive capabilities, and said drive adjuster for adjusting the drive capability comprises means for selecting and activating one of said driving stages, said selected driving stage having an adequate drive capability. In this case, the adjustment of the drive capability is achieved by selecting and activating the specific driving stage, which has the most adequate drive capability for generating a required output pulse form. If the steepness of the resulting pulse is too high with respect to the target steepness, the driving stage with the next lower drive capability is selected for the subsequent pulse. On the contrary, if the edge of the resulting signal is too smooth, the driving stage with the next higher drive capability will be selected for generating the subsequent pulse.

In this case, the individual drive capabilities of the respective driving stages are preferably chosen so as to provide the best possible graduation of the range of required drive capabilities for generating adequate pulses over the expected range of external load capacities.

It should be noted that for the two embodiments the following rule is valid: the greater the number of driving stages is for covering the range of required values, the smaller are the variations between two successive drive capabilities of the driving device and the better the predetermined steepness can be matched. However for economic reasons, the overall number of driving stages is kept within a reasonable range.

It should further be noted that a combination of the two described embodiments is also possible. In this case, the driving device comprises a plurality of driving stages with different individual drive capabilities, and the overall drive capability of the driving device is adjusted by combining the individual drive capabilities of several driving stages by simultaneously activating these stages.

A monitor for monitoring the outgoing pulse steepness preferably comprises a comparator for comparing the output voltage after a predetermined time interval with a reference voltage, said time interval starting with the beginning of the pulse and said reference voltage corresponding to the voltage level of a pulse with said predetermined target steepness after said time interval.

A possible implementation of this circuit comprises a comparator having a first input connected to a reference voltage source and a second input connected to the output of said output circuit. The comparator is clocked by a trigger signal in order to generate after a predetermined time interval a difference signal which is characteristic of the difference between the target voltage and the output voltage after said time interval. The difference signal generated by the comparator can then be used in a selector either to increase or decrease the number of activated driving stages or to activate the driving stage with the next higher or lower drive capability.

It should be noted that for a digital integrated circuit device comprising a plurality of output terminals and a plurality of output circuits, one output circuit being associated with each output terminal, wherein each of said output circuits comprises a driving device with adjustable drive capability for generating an output pulse, it is not necessary to provide an individual control circuit for each output circuit. In this case it is sufficient to provide a monitor for monitoring the output pulses steepness of at least one of said output circuits, and a drive adjuster for adjusting the drive capability of each driving device depending on the difference between the monitored steepness and a predetermined steepness. This can be implemented by providing one master control circuit which can monitor either the pulses of one single driving device or the pulses of several driving devices. The selection signals at the output of the means for adjusting the drive capability can be duplicated and applied to each output driving devices at each output terminal.

BRIEF DESCRIPTION OF THE DRAWINGS

The present invention will be more apparent from the following description of a not limiting embodiment with reference to the attached drawings, wherein:

Referring to FIG. 1, an embodiment of a new output circuit comprises a sensing device SENS, a selector SEL and a bank of output driving stages which are coupled in parallel.

DETAILED DESCRIPTION OF THE INVENTION

Figure 1:
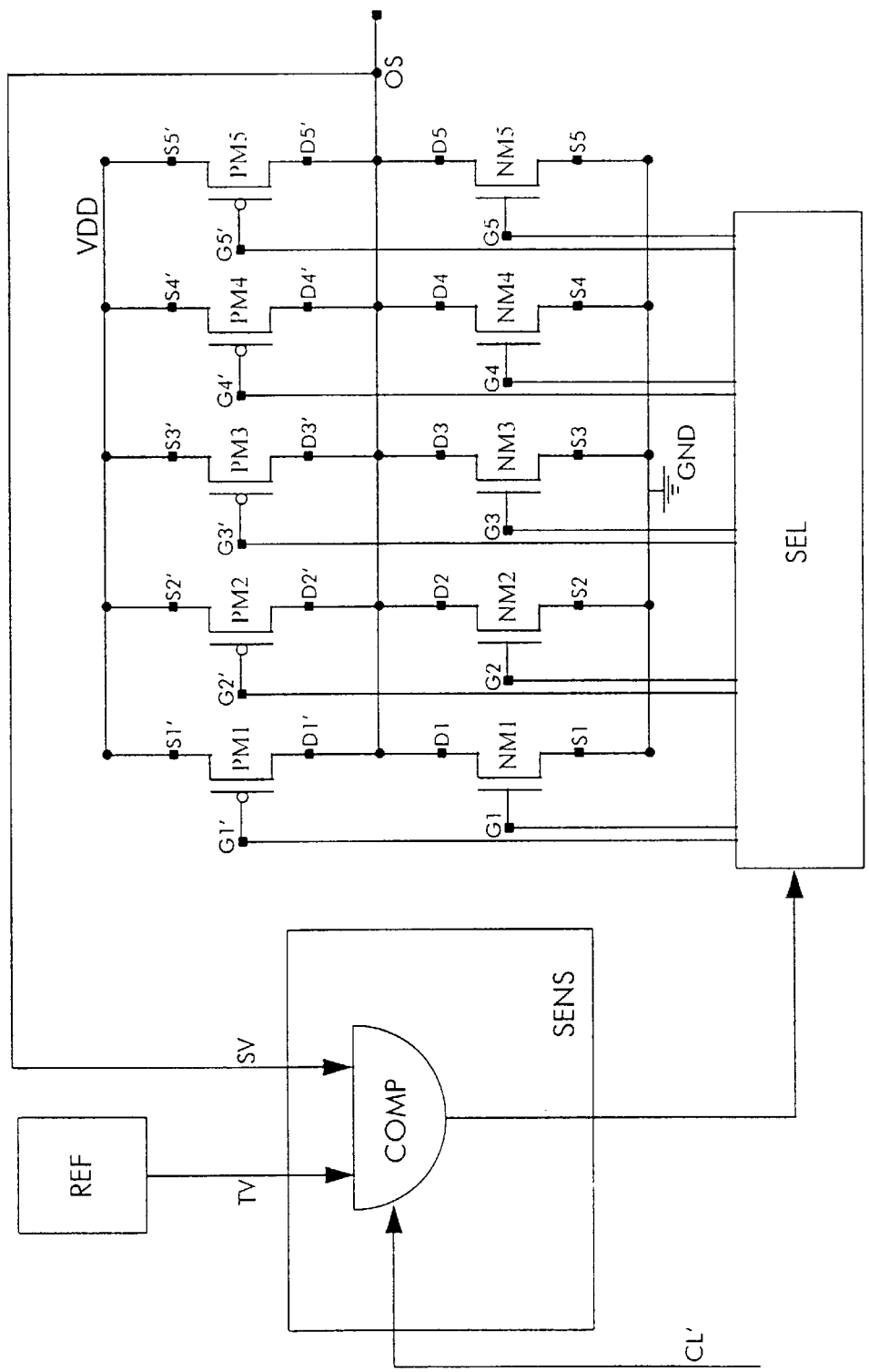
FIG. 1: a diagrammatic representation of an embodiment of the output circuit.

The output driving stages advantageously comprise a couple of transistors of opposite type. In the implementation shown in FIG. 1, the driving stages comprise P-mosfet-N-mosfet couples PM1-NM1, PM2-NM2, PM3-NM3, PM4-NM4, PM5-NM5. The different driving stages are coupled in parallel. This means that the drains D1', D2', D3', D4', D5', D1, D2, D3, D4 and D5 are interconnected, the sources S1, S2, S3, S4 and S5 are interconnected (ground GND) and the sources S1', S2', S3', S4', S5' are interconnected (voltage supply VDD).

The gate nodes G1, G1', G2, G2', G3, G3', G4, G4', G5 and G5' of the output driving mosfets PM1-NM1, PM2-

NM2, PM3-NM3, PM4-NM4 and PM5-NM5 are connected to different outputs of the selector SEL so that they receive independent selection signals from the selector SEL, whereby the different transistors can be individually activated by said selector SEL. In other words, the output driving stages PM1-NM1, PM2-NM2, PM3-NM3, PM4-NM4 and PM5-NM5 are individually enabled or disabled via these selection signals of the selector SEL.

In a first embodiment, the drive capabilities of the output driving stages PM1-NM1, PM2-NM2, PM3-NM3, PM4-NM4 and PM5-NM5 are identical. If all of these driving stages are enabled, their individual drive capabilities are combined and an output signal OS with the sharpest possible edges is generated. If all but one output driving device are disabled, output pulses OS with the smoothest possible edges are generated. By enabling or disabling more output driving stages, the steepness of the edges of the sourced output pulses OS can gradually be controlled.

Normally, the output circuit starts in a safe mode wherein the edges are as smooth as possible. Based on the output of the sensing device SENS, more output driving stages are enabled until the steepness of the pulse edges exceeds a target value TV (see also FIG. 2). The sensing device SENS then further monitors the outgoing pulses OS and adjusts the steepness of the edges by enabling or disabling output devices if the edges of the monitored pulses OS become too smooth or too sharp respectively.

In a second embodiment, the individual drive capabilities of the driving stages PM1-NM1, PM2-NM2, PM3-NM3, PM4-NM4 and PM5-NM5 are different with respect to each other and chosen so as to be adapted to an expected range of load capacities. For instance, the driving stage PM1-NM1 has the smallest drive capability, which is adapted to a small external load, and the driving stage PM5-NM5 has the largest drive capability, which is adapted to a large external load. This means that for a given external load, the driving stage PM1-NML generates output pulses OS with the smoothest possible edges whereas the driving stage PM5-NM5 generates output pulses OS with the sharpest possible edges. By enabling or disabling a driving stage with the next higher or lower drive capability, the steepness of the edges of the sourced output pulses OS can gradually be controlled.

Normally, the output circuit starts in a safe mode wherein the edges are as smooth as possible by activating the driving stage PM1-NM1. Based on the output of the sensing device SENS, the output stage with the next higher drive capability is enabled until the steepness of the pulse edges exceeds a target value TV. The sensing device SENS then further monitors the outgoing pulses OS and adjusts the steepness of the edges by enabling another driving stage if the edges of the monitored pulses OS become too smooth or too sharp respectively.

Figure 2:
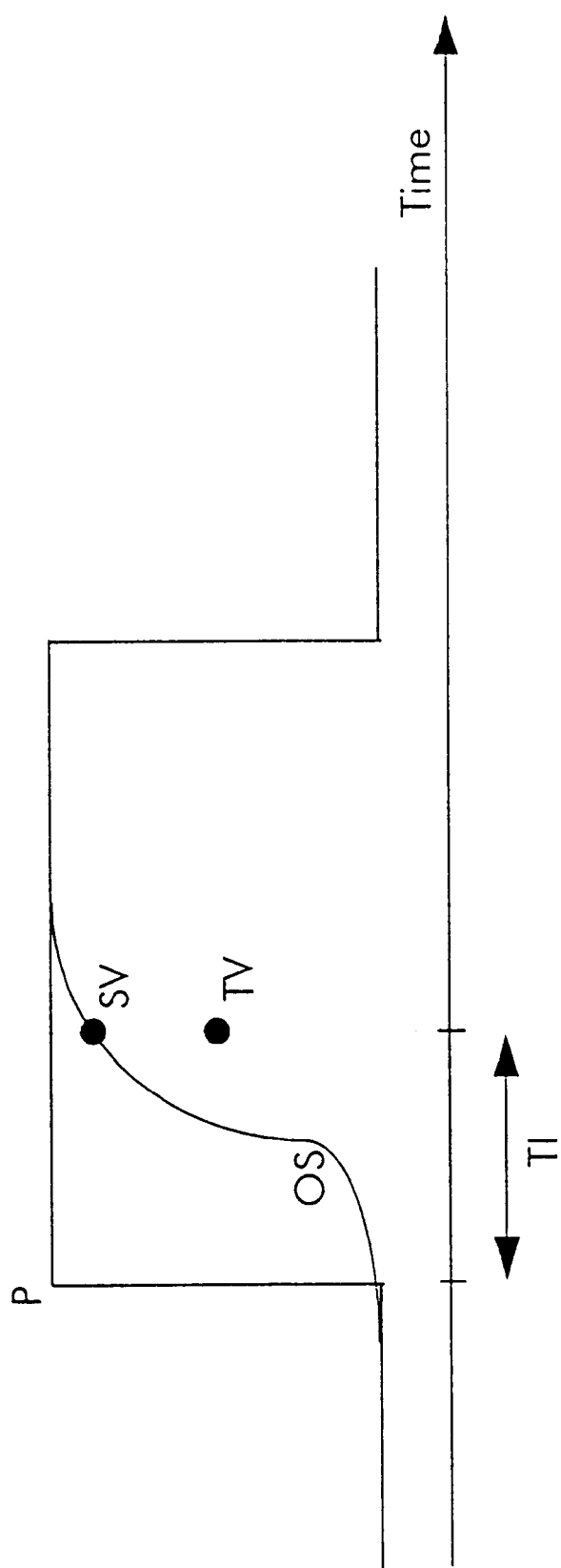
FIG. 2: a graphic chart of the output voltage versus time.

The sensing device SENS in fact is a kind of comparator COMP which compares the rising slope of the outgoing pulses OS with a predetermined target slope. The sensing device SENS thereto measures the output signal level SV after a predetermined time interval TI has elapsed from the starting of the pulse interval P. This is illustrated in FIG. 2. The sensing device SENS is controlled by a phase-shifted clock signal CL'. The phase-shift equals the predetermined time interval TI.

When the sensing circuit SENS receives a pulse at its clock input, it monitors the output signal level SV and compares this level to a target value TV received from a reference value generator REF. The target value TV thereby represents the voltage level after the time interval TI of a pulse having exactly the predetermined steepness.

The monitored output signal level SV corresponds to a certain rising slope (SV/TI). This rising slope is compared to the target slope (TV/TI). If this rising slope (SV/TI) is higher than the value (TV/TI), the sensing device SENS causes the selector SEL to disable an output driving device. On the other hand, when the monitored output signal value SV corresponds to a rising slope (SV/TI) which is lower than that (TV/TI), the sensing device SENS instructs the selector SEL to enable an additional output driving device.

The signal level SV after the time interval TI being compared for each pulse, the output circuit continuously monitors the steepness of the outgoing pulses. If a divergence between the effective steepness of the outgoing pulse and the target steepness occurs, the circuit reacts by adjusting its overall drive capability so that the form of the subsequent pulse better matches the predetermined pulse form.

It is noticed that for a digital integrated circuit which has several input/output terminals, no control circuit (sensing device sens+selector sel) per input/output terminal has to be provided, but one master control circuit can be included and the selection signals at the output of the selector SEL can be duplicated and applied to each bank of output driving devices at each input/output terminal.

What is claimed is:

1. An output circuit for digital integrated circuit devices, said output circuit comprising
   a driving device with adjustable drive capability for generating an output pulse from an output terminal,
   said driving device comprising:
   a monitor for monitoring the steepness of the output pulse by comparing the output voltage of the output pulse after a predetermined time interval with a reference voltage; and
   a driving stage selector for adjusting the drive capability of said driving device so as to minimize the difference between the monitored steepness and a predetermined target steepness.

2. The output circuit according to claim 1, wherein
   said driving device comprises a plurality of driving stages, said driving stages being activatable independently from each other, and said driving stage selector comprises a selection circuit for activating one or more driving stages from said plurality of driving stages.

3. The output circuit according to claim 2, wherein each of said
   driving stages has identical drive capability.

4. The output circuit according to claim 2, wherein each of
   said driving stages has a different drive capability.

5. The output circuit according to claim 1, wherein
   said predetermined time interval starts with the beginning of the output pulse and said reference voltage corresponds to the voltage level of a pulse with said predetermined target steepness after said predetermined time interval lapses.

6. The output circuit according to claim 1, wherein said
   monitor for monitoring the steepness of the output pulse comprises a comparator, and a first input of said comparator being connected to a reference voltage source and a second input of said comparator being connected to said output terminal of said output circuit.

7. A method for generating output pulses in an output circuit of a digital integrated circuit device, said output circuit comprising a driving device having an adjustable drive capability, wherein said method comprises:

setting a target steepness;

monitoring the steepness of the output pulses by comparing the output voltage of said output circuit after a predetermined time interval to a reference voltage; and adjusting the drive capability of said driving device so as to minimize the difference between the monitored steepness and a predetermined target steepness.

8. The method according to claim 7, said driving device comprising a plurality of driving stages, wherein adjusting the drive capability of said driving device comprises activating at least one driving stage out of said plurality of driving stages.

9. The method according to claim 7, said driving device comprising a plurality of driving stages, each having a different drive capability, wherein adjusting the drive capability of said driving device comprises activating only one driving stage from said plurality of driving stages.

10. The method according to claim 7, wherein said predetermined time interval starts with the beginning of the output pulse and said reference voltage corresponds to the voltage level of a pulse with said predetermined target steepness after said predetermined time interval lapses.

11. A digital integrated circuit device comprising an output circuit according to claim 1.

12. A digital integrated circuit device comprising:

a plurality of output terminals and a plurality of output circuits, wherein one output circuit is associated with each output terminal, each of said output circuits comprising a driving device with adjustable drive capability for generating an output pulse, further comprising:

a monitor for monitoring the steepness of the output pulse by comparing the output voltage of the output pulse after a predetermined time interval with a reference voltage; and a driving stage selector for adjusting the drive capability of each driving device so as to minimize the difference between the monitored steepness and a predetermined target steepness.

13. The output circuit according to claim 3, wherein a difference signal from said monitor commands said driving stage selector to activate at least one of said plurality of driving stages.

14. The output circuit according to claim 4, wherein a difference signal from said monitor commands said driving stage selector to activate only one of said plurality of driving stages.

15. The output circuit according to claim 6, wherein said comparator is clocked by a trigger signal after said predetermined time interval in order to generate a difference signal which is characteristic of the difference between said reference voltage and said output voltage after said predetermined time interval lapses.

* * * * *